US012033838B2

(12) United States Patent
Takayoshi et al.

(10) Patent No.: US 12,033,838 B2
(45) Date of Patent: Jul. 9, 2024

(54) PLASMA PROCESSING APPARATUS AND WEAR AMOUNT MEASUREMENT METHOD

(71) Applicant: TOKYO ELECTRON LIMITED, Tokyo (JP)

(72) Inventors: Joji Takayoshi, Miyagi (JP); Ryuta Akimoto, Miyagi (JP); Takehito Watanabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 60 days.

(21) Appl. No.: 17/196,089

(22) Filed: Mar. 9, 2021

(65) Prior Publication Data

US 2021/0305027 A1 Sep. 30, 2021

(30) Foreign Application Priority Data

Mar. 24, 2020 (JP) .................................. 2020-052708
Nov. 13, 2020 (JP) .................................. 2020-189617

(51) Int. Cl.
*H01J 37/32* (2006.01)
*H01J 37/244* (2006.01)
*H01L 21/67* (2006.01)

(52) U.S. Cl.
CPC .. *H01J 37/32935* (2013.01); *H01J 37/32605* (2013.01); *H01J 37/32807* (2013.01); *H01J 37/32917* (2013.01); *H01J 37/244* (2013.01); *H01J 37/32091* (2013.01); *H01J 37/32642* (2013.01); *H01L 21/67069* (2013.01)

(58) Field of Classification Search
CPC ................................................ H01L 21/67069
See application file for complete search history.

(56) References Cited

U.S. PATENT DOCUMENTS

| | | | | |
|---|---|---|---|---|
| 5,942,889 A | * | 8/1999 | Loewenhardt | .... H01J 37/32935 324/754.28 |
| 7,341,644 B2 | * | 3/2008 | Sakano | ............. H01L 21/31116 118/712 |
| 8,043,971 B2 | * | 10/2011 | Sasaki | ............... H01J 37/32642 156/345.44 |
| 8,425,791 B2 | * | 4/2013 | Koshimizu | ....... H01J 37/32522 216/61 |
| 8,641,916 B2 | * | 2/2014 | Yatsuda | ............ H01J 37/32146 438/689 |

(Continued)

FOREIGN PATENT DOCUMENTS

JP 2015-115541 A 6/2015

*Primary Examiner* — Kurt Sweely
(74) *Attorney, Agent, or Firm* — Nath, Goldberg & Meyer; Jerald L. Meyer; Tanya E. Harkins (57) ABSTRACT

A plasma processing apparatus including a processing container and a conductive member, includes a plasma generator configured to generate plasma in the processing container, a power application part configured to apply a DC power to the conductive member in a state in which plasma is generated in the processing container by the plasma generator, a measurement part configured to measure a physical quantity related to the DC power applied by the power application part, and a calculator configured to obtain a wear amount of the conductive member using the measured physical quantity related to the DC power in a correlation function between the wear amount of the conductive member and the physical quantity related to the DC power.

12 Claims, 9 Drawing Sheets

(56) References Cited

U.S. PATENT DOCUMENTS

2004/0259276 A1* 12/2004 Yue .................. H01J 37/32935
                                                        118/712
2007/0224709 A1*  9/2007 Ogasawara ....... H01J 37/32642
                                                        700/121
2017/0053819 A1*  2/2017 Richardson ............ G01N 21/88

* cited by examiner

PLASMA PROCESSING APPARATUS AND WEAR AMOUNT MEASUREMENT METHOD

CROSS-REFERENCE TO RELATED APPLICATIONS

This application is based upon and claims the benefit of priority from Japanese Patent Application Nos. 2020-052708 and 2020-189617, filed on Mar. 24 and Nov. 13, 2020, respectively, the entire contents of which are incorporated herein by reference.

TECHNICAL FIELD

The present disclosure relates to a plasma processing apparatus and a wear amount measurement method.

BACKGROUND

Conventionally, there is known a plasma processing apparatus that performs plasma processing on a workpiece such as a wafer or the like using plasma. Such a plasma processing apparatus includes, for example, a stage that holds a workpiece and also serves as an electrode in a processing container capable of forming a vacuum space. The plasma processing apparatus applies a predetermined radio frequency power to the stage to thereby perform plasma processing on the workpiece placed on the stage.

PRIOR ART DOCUMENT

Patent Document
Patent Document 1: Japanese Patent Application Publication No. 2015-115541

SUMMARY

According to one embodiment of the present disclosure, a plasma processing apparatus including a processing container and a conductive member, includes a plasma generator configured to generate plasma in the processing container, a power application part configured to apply a DC power to the conductive member in a state in which plasma is generated in the processing container by the plasma generator, a measurement part configured to measure a physical quantity related to the DC power applied by the power application part, and a calculator configured to obtain a wear amount of the conductive member using the measured physical quantity related to the DC power in a correlation function between the wear amount of the conductive member and the physical quantity related to the DC power.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a plasma processing apparatus and a wear amount measurement method disclosed herein will be described in detail with reference to the drawings. In addition, the same or corresponding parts are designated by like reference numerals in each drawing. Furthermore, the plasma processing apparatus and the wear amount measurement method disclosed herein are not limited by the embodiments. In addition, the terms "upper" and "lower" are based on the illustrated states and are used for the sake of convenience.

In recent years, attempts have been made to cancel the influence of a process shift due to parts wear and the like by changing various control parameters through feedback control. In particular, among the parts that make up a chamber, an upper electrode (CEL) has a large influence of wear on a characteristic value. Therefore, in order to restore the etching rate shift due to wear and improve the uniformity of a deteriorated product, it is desirable to accurately grasp the wear amount of the upper electrode and control it with an appropriate control amount.

Normally, the accurate wear amount of a part needs to be measured with a caliper or the like by first opening a chamber and then removing a target part, or needs to be asked to an outside contractor. This may deteriorate the productivity. Further, as a method of measuring a wear amount without opening a chamber, there is a method of estimating a wear amount from an RF integration time.

However, it is difficult to adjust a Knob control amount because the wear amount of a part differs depending on the conditions.

Embodiment

[Configuration of Plasma Processing Apparatus]

Figure 1:
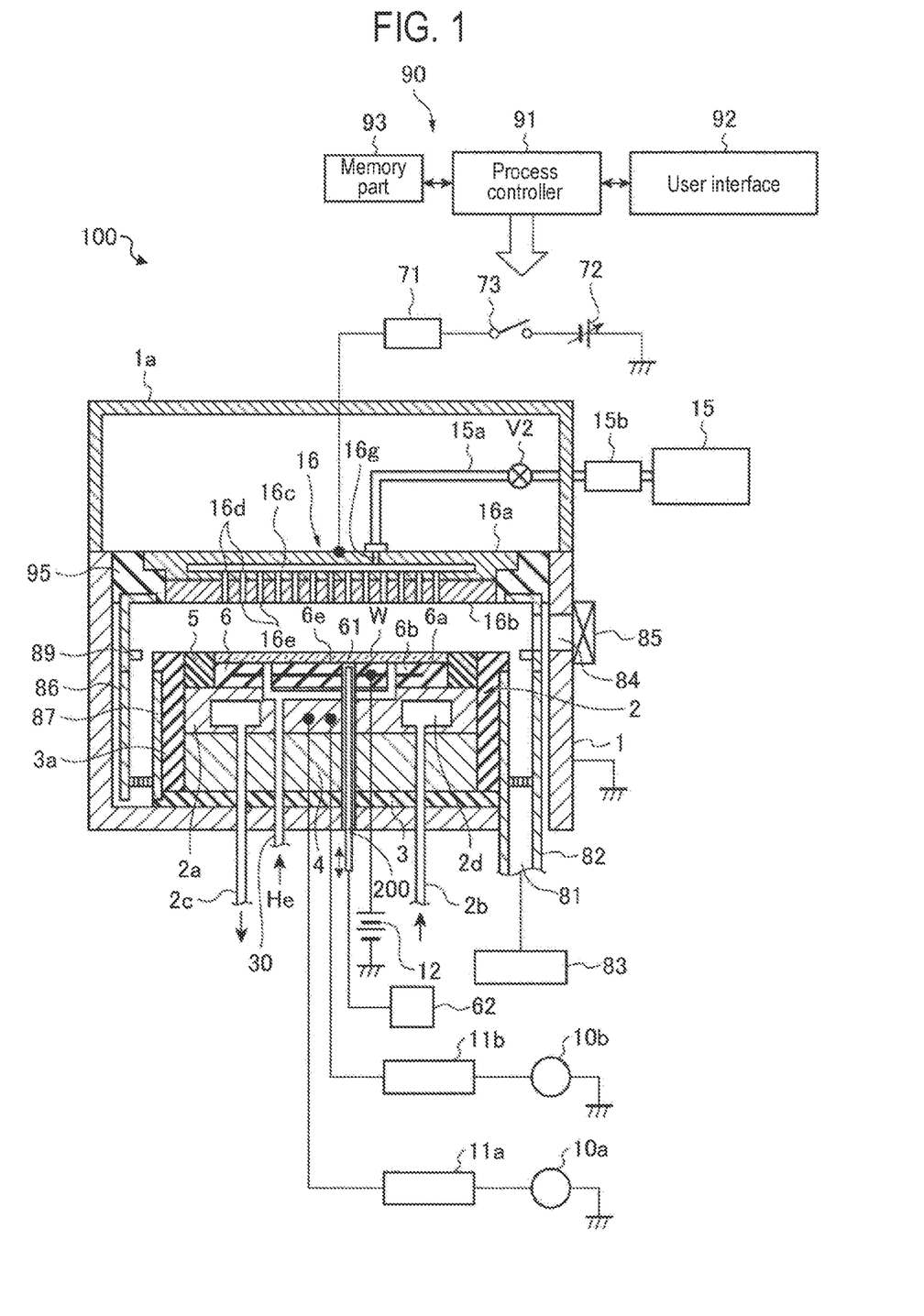
FIG. 1 is a schematic sectional view showing a configuration of a plasma processing apparatus according to an embodiment.

FIG. 1 is a schematic sectional view showing a configuration of a plasma processing apparatus 100 according to an embodiment. The plasma processing apparatus 100 includes a processing container 1 that has an airtight configuration and serves as an electrically ground potential. The processing container 1 has a cylindrical shape and is made of, for example, aluminum or the like. The processing container 1 defines a processing space in which plasma is generated. A stage 2 for horizontally supporting a semiconductor wafer (hereinafter simply referred to as "wafer") W, which is a workpiece, is provided in the processing container 1. The stage 2 includes a base member (base) 2a and an electrostatic chuck (ESC) 6. The base member 2a is made of a conductive metal, for example, aluminum or the like and has a function as a lower electrode. The electrostatic chuck 6 has a function of electrostatically attracting the wafer W. The stage 2 is supported by a support stand 4. The support stand 4 is supported by a support member 3 made of, for example, quartz. Further, a focus ring 5 is provided on the upper outer periphery of the stage 2. The focus ring 5 is a conductive member and is made of, for example, a silicon-containing material. Examples of the silicon-containing material include silicon (Si) and silicon carbide (SiC). Further, in the processing container 1, a cylindrical inner wall member 3a made of, for example, quartz or the like is provided so as to surround the stage 2 and the support stand 4.

A first RF power source 10a is connected to the base member 2a via a first matcher 11a, and a second RF power source 10b is connected to the base member 2a via a second matcher 11b. The first RF power source 10a is mainly used for plasma generation, and is configured so that a radio frequency power of a predetermined frequency selected from a range of 150 MHz to 10 MHz is applied from the first RF power source 10a to the base member 2a of the stage 2. The second RF power source 10b is mainly used for ion attraction (for bias), and is configured so that a radio frequency power of a predetermined frequency selected from a range of 40 MHz to 100 KHz, which is lower than that of the first RF power source 10a, is applied from the second RF power source 10b to the base member 2a of the stage 2. In this way, the stage 2 is configured so that a voltage can be applied thereto.

The frequency of the first RF power source 10a also considerably acts on ion attraction in addition to the plasma generation. The lower the frequency, the larger the ratio of ion attraction action. Further, the frequency of the second RF power source 10b considerably acts on plasma generation in addition to the ion attraction. The higher the frequency, the larger the ratio of plasma generation action.

On the other hand, above the stage 2, a shower head 16 having a function as an upper electrode is provided so as to face the stage 2 in parallel. The shower head 16 and the stage 2 function as a pair of electrodes (upper electrode and lower electrode).

The electrostatic chuck 6 is configured by interposing an electrode 6a between insulators 6b. A DC power source 12 is connected to the electrode 6a. Then, when a DC voltage is applied from the DC power source 12 to the electrode 6a, the wafer W is attracted by the Coulomb force.

A refrigerant flow path 2d is formed inside the stage 2. A refrigerant inlet pipe 2b and a refrigerant outlet pipe 2c are connected to the refrigerant flow path 2d. The stage 2 can be controlled to a predetermined temperature by circulating an appropriate refrigerant such as cooling water or the like in the refrigerant flow path 2d. Further, a gas supply pipe 30 for supplying a cold energy transfer gas (backside gas) such as a helium gas or the like to the back surface of the wafer W is provided so as to penetrate the stage 2 and the like. The gas supply pipe 30 is connected to a gas source (not shown). With these configurations, the wafer W attracted and held by the electrostatic chuck 6 on the upper surface of the stage 2 is controlled to a predetermined temperature.

Further, the focus ring 5 provided on the upper outer periphery of the stage 2 is also controlled to a predetermined temperature. Alternatively, the wafer W and the focus ring 5 may be controlled to a predetermined temperature by providing a heater inside the stage 2 or the electrostatic chuck 6 and heating the heater to a predetermined temperature.

The stage 2 has a plurality of, for example, three pin penetration holes 200 (only one pin penetration hole shown in FIG. 1). Lifter pins 61 are arranged inside the pin penetration holes 200. The lifter pins 61 are connected to a driving mechanism 62 and are moved up and down by the driving mechanism 62.

The shower head 16 described above is provided on the top wall portion of the processing container 1. The shower head 16 includes a main body portion 16a and an upper top plate 16b constituting an electrode plate. The shower head 16 is supported on the upper portion of the processing container 1 via an insulating member 95. The main body portion 16a is made of a conductive material, for example, aluminum having an anodized surface, and is configured so that the upper top plate 16b can be detachably supported under the main body portion 16a. The upper top plate 16b is a conductive member, and is made of, for example, a silicon-containing material. Examples of the silicon-containing material include silicon (Si) and silicon carbide (SiC).

The main body portion 16a is provided with a gas diffusion chamber 16c formed therein. Further, the main body portion 16a has a large number of gas flow holes 16d formed at the bottom thereof so as to be located below the gas diffusion chamber 16c. Moreover, the upper top plate 16b has gas introduction holes 16e formed in the thickness direction of the upper top plate 16b so as to overlap with the gas flow holes 16d described above. With such a configuration, the processing gas supplied to the gas diffusion chamber 16c is dispersed in a shower shape and supplied into the processing container 1 through the gas flow holes 16d and the gas introduction holes 16e.

The main body portion 16a has a gas introduction port 16g for introducing the processing gas into the gas diffusion chamber 16c. One end of a gas supply pipe 15a, is connected to the gas introduction port 16g. A processing gas supply source (gas supply part) 15 for supplying the processing gas is connected to the other end of the gas supply pipe 15a. In the gas supply pipe 15a, a mass flow controller (MFC) 15b and an opening/closing valve V2 are provided sequentially from the upstream side. The processing gas for plasma etching is supplied to the gas diffusion chamber 16c from the processing gas supply source 15 via the gas supply pipe 15a. The processing gas is dispersed in a shower shape and is supplied from the gas diffusion chamber 16c into the processing container 1 through the gas flow holes 16d and the gas introduction holes 16e.

A variable DC power source 72 is electrically connected to the shower head 16 as the aforementioned upper electrode via a low-pass filter (LIT) 71. The variable DC power source 72 is configured so that the power supply can be turned on or off by an on/off switch 73. The current/voltage of the variable DC power source 72 and the on/off operation of the on/off switch 73 are controlled by a controller 90 described later. As will be described later, when a radio frequency is applied to the stage 2 from the first RF power source 10a and the second RF power source 10b to generate plasma in the processing space, if necessary, the on/off switch 73 is turned on by the controller 90, and a predetermined. DC voltage is applied to the shower head 16 as the upper electrode.

A cylindrical ground conductor 1a is provided so as to extend to above the height position of the shower head 16 from the side wall of the processing container 1. The cylindrical ground conductor 1a has a top wall in the upper portion thereof.

An exhaust port 81 is formed at the bottom of the processing container 1. A first exhaust device 83 is connected to the exhaust port 81 via an exhaust pipe 82. The first exhaust device 83 includes a vacuum pump, and is configured so that the inside of the processing container 1 can be depressurized to a predetermined degree of vacuum by operating the vacuum pump. On the other hand, a loading/unloading port 84 for the water W is provided on the side wall of the processing container 1. A gate valve 85 for opening and closing the loading/unloading port 84 is provided in the loading/unloading port 84.

A deposit shield 86 is provided along the inner wall surface inside the side portion of the processing container 1. The deposit shield 86 prevents an etching by-product (deposit) from adhering to the processing container 1. At the height position of the deposit shield 86 substantially flushing with the wafer W, there is provided a conductive member (GND block) 89 connected so that the potential with respect to the ground can be controlled, whereby abnormal discharge is prevented. The GND block 89 is a conductive member and is made of, for example, a silicon-containing material. Examples of the silicon-containing material include silicon (Si) and silicon carbide (SiC). Further, a deposit shield 87 extending along an inner wall member 3a is provided at the lower end of the deposit shield 86. The deposit shields 86 and 87 are removable.

The operation of the plasma processing apparatus 100 having the above configuration is generally controlled by the controller 90. The controller 90 includes a process controller 91 provided with a CPU and configured to control each part of the plasma processing apparatus 100, a user interface 92, and a memory part 93.

The user interface 92 includes a keyboard for a process manager to input commands for managing the plasma processing apparatus 100, a display for visualizing and displaying the operating status of the plasma processing apparatus 100, and the like.

The memory part 93 stores recipes in which a control program (software) for realizing various processes executed by the plasma processing apparatus 100 under the control of the process controller 91, processing condition data, and the like are stored. Men, if necessary, an arbitrary recipe is called from the memory part 93 in response to an instruction from the user interface 92 or the like and is executed by the process controller 91, whereby a desired process is performed in the plasma processing apparatus 100 under the control of the process controller 91. In addition, the recipes such as a control program, processing condition data and the like may be the ones stored in a non-transitory computer-readable storage medium (e.g., a hard disk, a CD, a flexible disk, a semiconductor memory, etc.), or may be and used on an online basis by receiving the same from another apparatus at any time via, for example, a dedicated line.

[Measurement of Wear Amount of Upper Electrode]

Next, the measurement of the wear amount of the upper electrode will be described. When plasma etching is performed, the upper top plate 16b as the electrode plate of the shower head 16, which is the upper electrode, is actually worn. In the following description, the wear amount of the upper top plate 16b will be described. However, when the main body portion 16a and the upper top plate 16b are considered as an integrated shower head, it can be said that the wear amount of the upper top plate 16b is the wear amount of the upper electrode (CEL).

Figure 2:
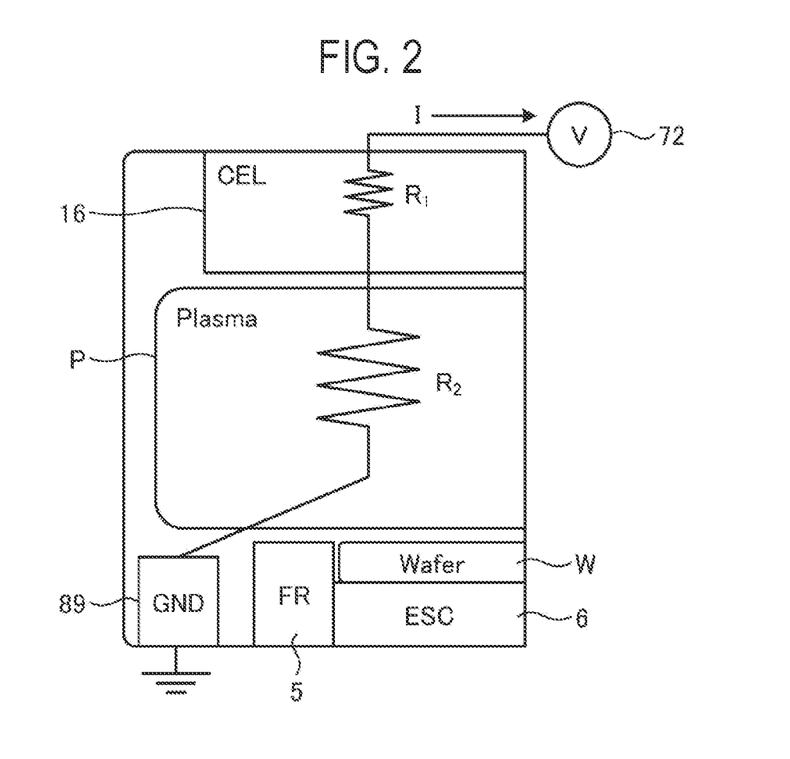
FIG. 2 is a diagram schematically showing an example of the state of electrical coupling of an upper electrode when plasma is generated.

FIG. 2 is a diagram schematically showing an example of the state of electrical coupling of the upper electrode when plasma is generated. As shown in FIG. 2, when the plasma P is generated in the processing container 1, the shower head 16 as an upper electrode (CEL) is electrically coupled to the GND block 89 at a ground potential via the plasma P. The shower head 16 and the plasma P may be electrically regarded as resistors R1 and R2, respectively. Therefore, when the plasma P is generated in the processing container 1, the space in the processing container 1 may be regarded as a series circuit in which the resistors R1 and R2 are connected in series. The variable DC power source 72 applies a DC power to the shower head 16 via the low-pass filter (LPF) 71 to measure a DC voltage and a direct current of the series circuit including the resistors R1 and R2. The variable DC power source 72 outputs a measurement result to the process controller 91.

Figure 3:
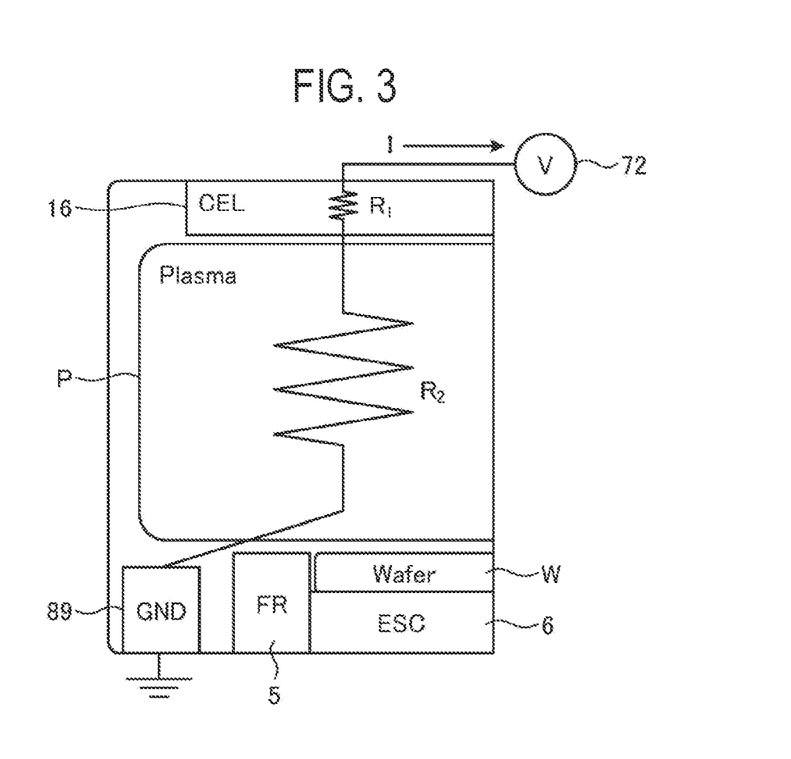
FIG. 3 is a diagram schematically showing an example of the state of electrical coupling of the worn upper electrode.

When plasma etching is performed, the upper top plate 16b of the shower head 16 as an upper electrode (CEL) is worn. As the upper top plate 16b is worn, the values of the resistors R1 and R2 are changed. FIG. 3 is a diagram schematically showing an example of the state of electrical coupling of the worn upper electrode. As shown in FIG. 3, when the upper top plate 16b is worn, the value of the resistor R1 of the upper top plate 16b decreases. On the other hand, as the upper top plate 16b is worn, the processing space in which the plasma P is generated expands in the processing container 1, and the value of the resistor R2 of the plasma P increases. In this regard, the combined resistance R of the series circuit including the resistors R1 and R2 is represented by the following equation (1).

$$R = R1 + R2 + \text{Rothers} \tag{1}$$

In the above equation, Rothers denotes the resistance of other part including the GND block 89 and is a constant value.

Then, assuming that the DC voltage and the direct current of the series circuit including the resistors R1 and R2 are V and I, respectively, the following equation (2) is established according to the Ohm's law.

$$V = R \cdot I \tag{2}$$

The following equation (3) is obtained by modifying the equation (2).

$$I/V = 1/R \tag{3}$$

From the equation (3), it can be seen that the combined resistance R of the series circuit including the resistors R1 and R2 is changed as the I/V is changed. Then, from the equations (1) and (3), it can be seen that the combined resistance R of the series circuit including the resistors R1 and R2 and the I/V are changed as the values of the resistors R1 and R2 are changed due to the wear of the upper top plate 16b. Thus, the plasma processing apparatus 100 according to the present embodiment obtains the wear amount of the upper top plate 16b by acquiring a plurality of direct currents I for a plurality of DC voltages V, and measuring a change in I/V, i.e., an I/V ratio which indicates a ratio of the change amount of the direct current I to the change amount of the DC voltage V, A wear amount measurement process will be described in detail below.

First, the process controller 91 receives an instruction from the user interface 92 and executes a reference data acquisition process for acquiring reference data to be used for calculating the wear amount. Specifically, the process controller 91 applies a plasma-generating RF power to the stage 2 using a measurement recipe stored in the memory part 93. Then, the process controller 91 acquires reference data by applying a DC power to the shower head 16 in a state where plasma is generated in the processing container 1. The process controller 91 executes the reference data acquisition process with the wafer mounted on the stage 2 as a protective cover for the stage 2.

For example, in the reference data acquisition process, an unused upper top plate 16b, an upper top plate 16b with a pseudo wear of 0.2 mm, and an upper top plate 16b with a pseudo wear of 2.0 mm are sequentially arranged in the plasma processing apparatus 100. The unused upper top plate 16b is an example of a reference conductive member having a wear amount of 0 mm and a specified thickness. The upper top plate 16b with a pseudo wear of 0.2 mm and the upper top plate 16b with a pseudo wear of 2.0 mm are examples of worn conductive members having wear amounts of 0.2 mm and 2.0 mm, respectively, and a thickness smaller than the specified thickness.

Regarding the sequentially-arranged upper top plates 16b having different wear amounts, the process controller 91 applies a DC power to the shower head 16 in a state in which plasma is generated in the processing container 1 and acquires a plurality of direct currents I with respect to a plurality of DC voltages V. Then, regarding the upper top plates 16b having different wear amounts, the process controller 91 obtains a relational expression representing the relationship between the DC voltage V and the direct current I, and acquires an inclination of each relational expression as a change in IN, i.e., a ratio of the change amount of the direct current I to the change amount of the DC voltage V. Hereinafter, the ratio of the change amount of the direct current I to the change amount of the DC voltage V, which is acquired as the reference data during the reference data acquisition process, will be referred to as a reference I/V ratio.

Figure 4A:
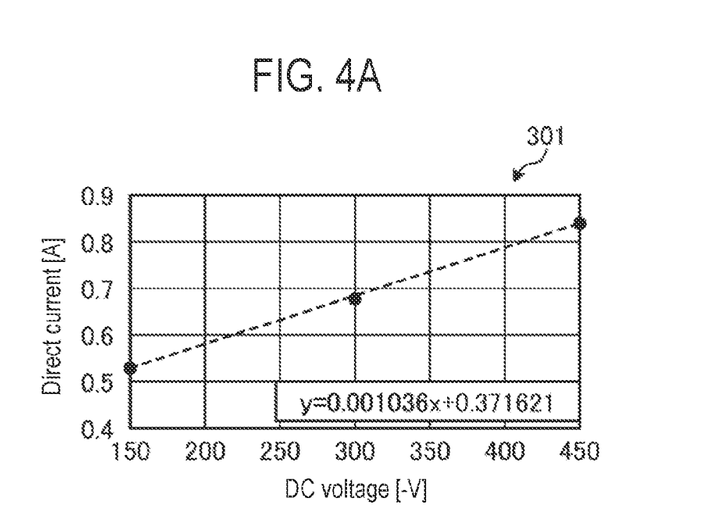
FIGS. 4A, 4B and 4C are diagrams showing examples of the relational expression between the DC voltage V and the direct current I when the upper top plates having different wear amounts are arranged.
Figure 4B:
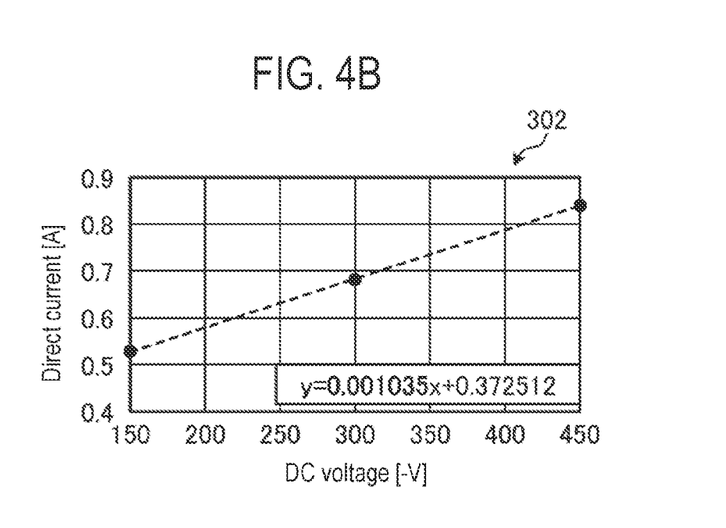
Figure 4C:
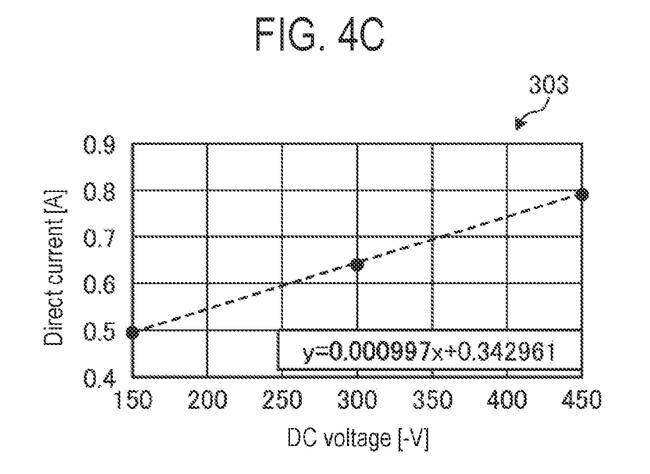

FIGS. 4A, 4B and 4C are diagrams showing examples of the relational expression between the DC voltage V and the direct current I when the upper top plates 16b having different wear amounts are arranged. In FIGS. 4A to 4C, graphs 301, 302 and 303 show the relational expressions between the DC voltage V and the direct current I when the upper top plates 16b having wear amounts of 0 mm, 0.2 mm and 2.0 mm, respectively, are arranged. These relational expressions can be obtained, for example, by performing linear approximation through the use of a least squares method for three points at which the DC voltage V is changed to −150V, −300V and −450V, In the examples of FIGS. 4A to 4C, the relational expression regarding the upper top plate 16b having a wear amount of 0 mm is the following equation (4), the relational expression regarding the upper top plate 16b having a wear amount of 0.2 mm is the following equation (5), and the relational expression regarding the upper top plate 16b having a wear amount of 2.0 mm is the following equation (6).

$$y = 0.001036x + 0.371621 \quad (4)$$

$$y = 0.001035x + 0.372512 \quad (5)$$

$$y = 0.000997x + 0.342981 \quad (6)$$

The process controller 91 acquires the inclination 0.001036 of the above formula (4) as a reference I/V ratio for the upper top plate 16b having a wear amount of 0 mm. Further, the process controller 91 acquires the inclination 0.001035 of the above formula (5) as a reference I/V ratio for the upper top plate 16b having a wear amount of 0.2 mm. In addition, the process controller 91 acquires the inclination 0.000997 of the above formula (6) as a reference I/V ratio for the upper top plate 16b having a wear amount of 2.0 mm.

Then, the process controller 91 obtains a correlation function representing the relationship between the wear amount of the upper top plate 16b and the I/V ratio using the reference I/V ratio for the upper top plates 16b having different wear amounts. Then, the process controller 91 stores the obtained correlation function in the memory part 93.

For example, the process controller 91 plots the reference I/V ratios for the upper top plates 16b having different wear amounts on a two-dimensional plane having the wear amount of the upper top plate 16b and the ratio as respective dimensions, and obtains the approximate expression of a linear function as a correlation function. The correlation function can be obtained, for example, by performing linear approximation through the use of a least squares method for three points at which the wear amounts are 0 mm, 0.2 mm and 2.0 mm.

Figure 5:
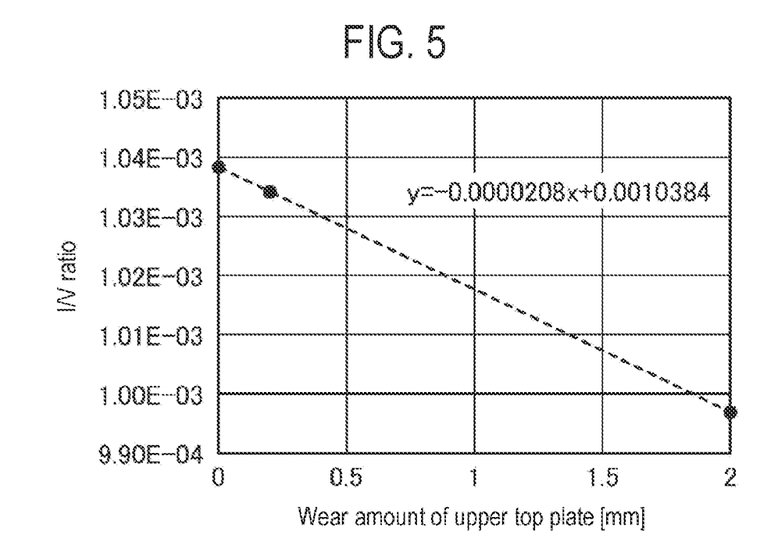
FIG. 5 is a diagram showing an example of the correlation function between the wear amount of the upper top plate and the UV ratio.

FIG. 5 is a diagram showing an example of the correlation function between the wear amount of the upper top plate 16b and the I/V ratio. FIG. 5 shows a correlation function representing the relationship between the wear amount of the upper top plate 16b and the reference I/V ratio, which is the inclination of each of the above equations (4) to (6). In the example of FIG. 5, the correlation function is represented by the following equation (7).

$$y = -0.0000208x + 0.0010384 \quad (7)$$

Thereafter, the process controller 91 performs plasma etching. Then, the process controller 91 periodically uses the measurement recipe to execute a wear time data acquisition process for acquiring wear time data using an installed upper top plate 16b used for plasma etching. Specifically, the process controller 91 functions as a plasma generator and a power application part, applies a plasma-generating RF power to the stage 2 through the use of the measurement recipe, and applies a DC power to the shower head 16 in a state in which plasma is generated in the processing container 1. Then, the process controller 91 functions as a measurement part, and acquires an I/V ratio measured for the worn shower head 16 as a wear time I/V ratio. Then, the process controller 91 functions as a calculator, and obtains a wear amount of the upper top plate 16b corresponding to the wear time I/V through the use of the correlation function stored in the memory part 93 and indicating the relationship between the wear amount of the upper top plate 16b and the I/V ratio. For example, when the correlation function is represented by the above equation (7), the process controller 91 substitutes the wear time I/V ratio for "y" in the equation (7) to obtain "x" which is a wear amount of the upper top plate 16b.

Next, the process controller 91 compares the calculated wear amount of the upper top plate 16b with a predetermined wear amount threshold value to determine whether or not the wear amount falls within a permissible value. For example, the process controller 91 stores the wear amount threshold value as 2 mm.

When the calculated wear amount of the upper top plate 16b is equal to or larger than the wear amount threshold value, the process controller 91 determines that the wear amount exceeds the permissible value. Then, the process controller 91 notifies the manager of the plasma processing apparatus 100 of the occurrence of an abnormality by displaying an alert on the display of the user interface 92 or the like. The manager receives the notification of the alert and replaces the upper top plate 16b. After replacing the upper top plate 16b, the process controller 91 measures a wear time IV ratio to calculate a wear amount. If the calculated wear amount falls within the permissible value, the process controller 91 determines that the wear amount is normal. Thereafter, the process controller 91 waits for an instruction from the user interface 92. When the instruction is received, the process controller 91 executes plasma etching according to the instruction.

On the other hand, when the calculated wear amount of the upper top plate 16b is less than the wear amount threshold value, the process controller 91 determines that the wear amount falls within the permissible value. Then, the process controller 91 calculates a Knob control amount according to the calculated wear amount of the upper top plate 16b and reflects it in the recipe at the time of execution of plasma etching. Thereafter, the process controller 91 executes plasma etching with the corrected recipe.

Figure 6:
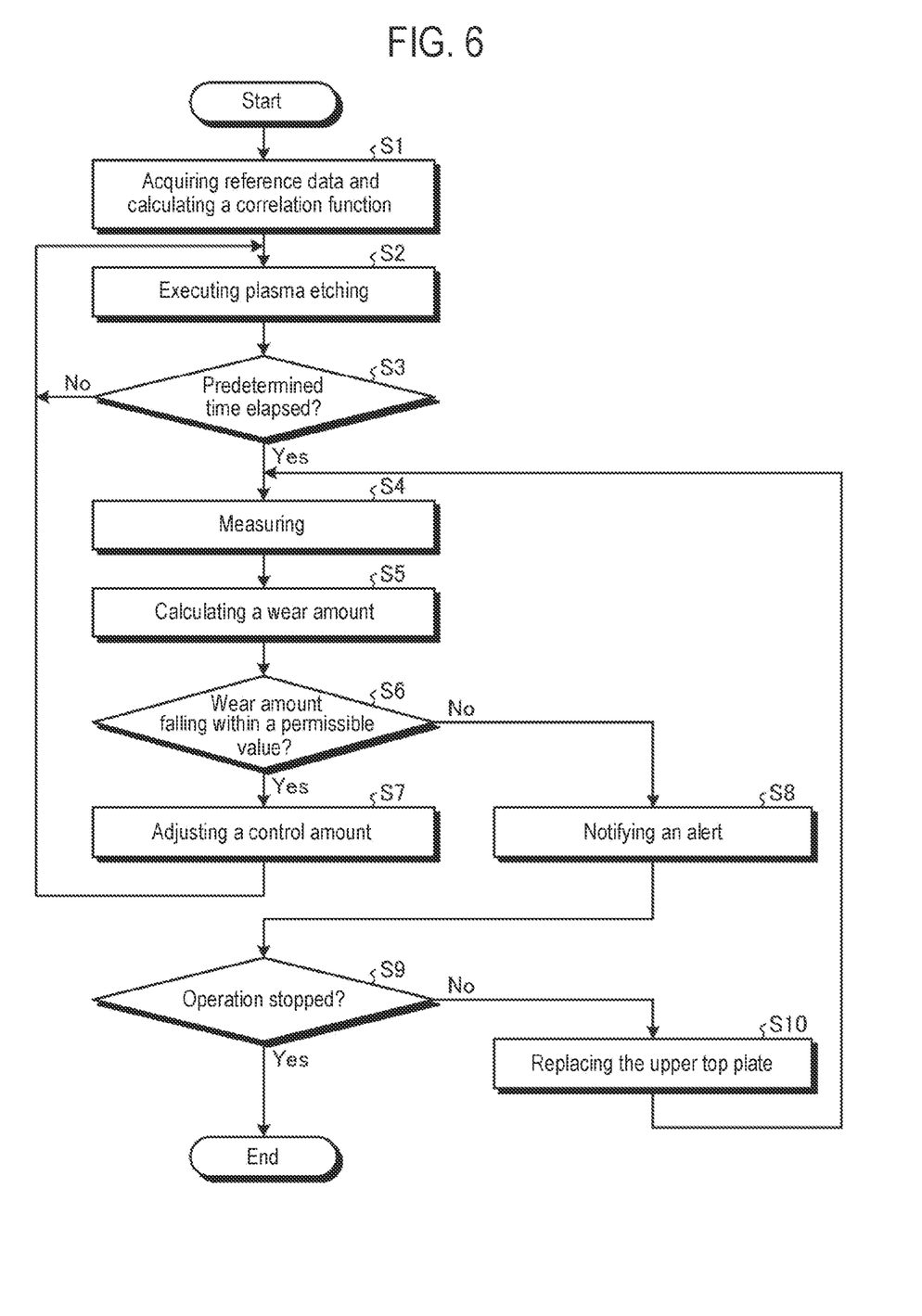
FIG. 6 is a flowchart showing an example of a flow of a plasma etching process using wear amount measurement by a plasma processing apparatus.

Next, the flow of the plasma etching process using the wear amount measurement by the plasma processing apparatus 100 according to the present embodiment will be described with reference to FIG. 6. FIG. 6 is a flowchart showing an example of the flow of the plasma etching process using the wear amount measurement by the plasma processing apparatus.

The process controller 91 acquires reference data including information on the reference I/V ratio for the upper top plates 16b having different wear amounts, and calculates a correlation function between the wear amount of the upper top plate 16b and the I/V ratio (step S1).

Thereafter, the process controller 91 executes plasma etching by the plasma processing apparatus 100 (step S2), and determines, for example, whether or not the integrated time of the plasma etching process has elapsed a predetermined time (step S3). If the predetermined time has not elapsed (step S3: negative), the process controller 91 returns to step S2 and continues to execute the plasma etching.

On the other hand, when the predetermined time has elapsed (step S3: affirmative), the process controller 91 decides to execute calculation of a wear amount. Then, the process controller 91 measures the wear time I/V ratio for the installed upper top plate 16b using the measurement recipe (step S4).

Next, the process controller 91 calculates a wear amount of the installed upper top plate 16b using the wear time I/V ratio with respect to the correlation function between the wear amount of the upper top plate 16b and the ratio (step S5).

Then, the process controller 91 compares the calculated wear amount with the wear amount threshold value to determine whether or not the wear amount falls within a permissible value (step S6).

On the other hand, when the wear amount falls within the permissible value (step S6: affirmative), the process controller 91 adjusts the Knob control amount according to the wear amount (step S7). For example, the process controller 91 adjusts the DC voltage V applied from the variable DC power source 72 to the shower head 16 according to the wear amount of the upper top plate 16b. The adjustment of the DC voltage V according to the wear amount of the upper top plate 16b will be described later.

Then, the process controller 91 returns to step S2 and executes plasma etching using the recipe in which the Knob control amount is corrected.

When the wear amount exceeds the permissible value step S6: negative), the process controller 91 notifies the manager of an alert (step S8).

Thereafter, the process controller 91 determines whether or not to stop the operation of the plasma processing apparatus 100 depending on whether or not an Operation stop instruction is received from the user interface 92 (step S9).

If the operation is not stopped (step S9: negative), the manager who received the alert replaces the upper top plate 16b (step S10), Thereafter, the plasma etching process using the wear amount measurement by the process controller 91 returns to step S4.

On the other hand, if it is determined that the operation is stopped (step S9: affirmative), the process controller 91 stops the operation of the plasma processing apparatus 100.

[Adjustment of the DC Voltage according to the Wear Amount of the Upper Top Plate]

Figure 9:
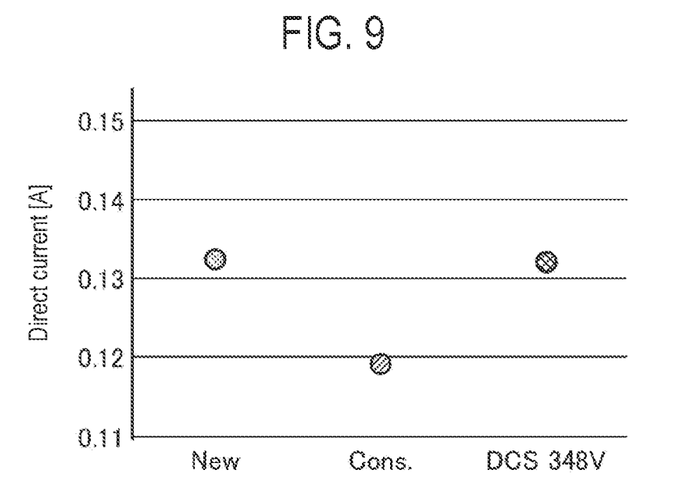
FIG. 9 is a diagram showing an example of the relationship between the wear amount of the upper top plate and the direct current corresponding to the DC voltage.
Figure 10:
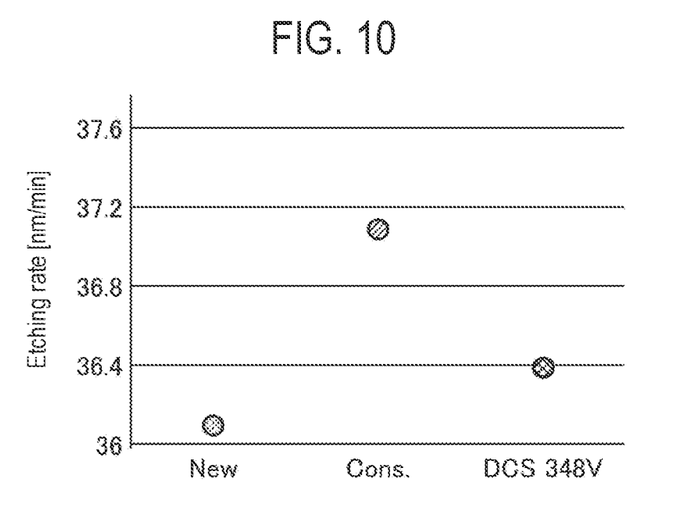
FIG. 10 is a diagram showing an example of the relationship between the wear amount of the upper top plate and the etching rate of the wafer.

Now, the adjustment of the DC voltage V according to the wear amount of the upper top plate 16b will be described with reference to FIGS. 9 and 10, FIG. 9 is a diagram showing an example of the relationship between the wear amount of the upper top plate 16b and the direct current I corresponding to the DC voltage V. In FIG. 9, New indicates a measured value of the direct current I when the wear amount of the upper top plate 16b is 0 mm. Further, "Cons." indicates a measured value of the direct current I when the wear amount of the upper top plate 16b is a value (e.g., 2.0 mm) larger than 0. In the measurement of "New" and "Cons.", the DC voltage V applied from the variable DC power source 72 to the shower head 16 is set to −300 V. and the corresponding direct current I is measured.

As shown in FIG. 9, it was confirmed that the direct current I flowing through the shower head 16 decreases from the initial value of 0.133 A to 0.119 A as the wear amount of the upper top plate 16b increases.

FIG. 10 is a diagram showing an example of the relationship between the wear amount of the upper top plate 16b and the etching rate of the wafer W. In FIG. 10, New indicates a measured value of the etching rate of the wafer W when the wear amount of the upper top plate 16b is 0 mm. Further, "Cons." indicates a measured value of the etching rate of the wafer W when the wear amount of the upper top plate 16b is a value e.g., 2.0 mm) larger than 0. In the measurement of "New" and "Cons.", the DC voltage V applied from the variable DC power source 72 to the shower head 16 is set to −300 V, and the corresponding etching rate is measured.

As shown in FIG. 10, it was confirmed that the etching rate of the wafer W increases from the initial value of 36.09 nm/min to 37.01 nm/min as the wear amount of the upper top plate 16b increases. Presumably, this is because the processing space in the processing container 1 is expanded due to the wear of the upper top plate 16b, and as a result, the electron density of the plasma in the processing container 1 is lowered. The decrease in the electron density of the plasma in the processing container 1 appears as a decrease in the direct current I flowing through the shower head 16, as shown in FIG. 9.

Therefore, the process controller 91 adjusts the DC voltage V applied from the variable DC power source 72 to the shower head 16 according to the wear amount of the upper top plate 16b so that the decrease in the direct current I is eliminated. For example, an experiment or the like is performed to obtain in advance the correspondence information in which the wear amount of the upper top plate 16b and the adjustment value of the DC voltage V are associated with each other. The correspondence information in which the wear amount of the upper top plate 16b and the adjustment value of the DC voltage V are associated with each other may be stored in the memory part 93. Then, the process controller 91 may read the adjustment value corresponding to the wear amount of the upper top plate 16b from the correspondence information and may adjust the DC voltage V so as to become the adjustment value. In addition, for example, the process controller 91 may adjust the DC voltage V according to the wear amount of the upper top plate 16b so that the decreased direct current I returns to the initial value.

In FIG. 9, the measured value of the direct current I after the DC voltage V applied to the upper top plate 16b having a wear amount of 2.0 mm is adjusted from −300 V to −348 V is indicated as "DCS 348V". The process controller 91 can return the corresponding direct current I from 0.119 A to the initial value 0.133 A by adjusting the DC voltage V from −300 V to −348 V.

In FIG. 10, the etching rate of the wafer W after the DC voltage V applied to the upper top plate 16b having a wear amount of 2.0 mm is adjusted from −300 V to −348 V is indicated as "DCS 348V", As can be seen from FIG. 10, by adjusting the DC voltage V, the etching rate of the wafer W can be corrected from 37.01 nm/min to 36.39 nm/min which is close to the initial value of 36.09 nm/min.

As described above, the plasma processing apparatus according to an embodiment is a plasma processing apparatus having a processing container and a conductive member (e.g., an upper top plate 16b), and includes a plasma generator, a power application part, a measurement part, and a calculator. The plasma generator generates plasma in the processing container. The power application part applies a DC power to the conductive member in a state in which plasma is generated in the processing container by the plasma generator. The measurement part measures a physical quantity (e.g., a wear time I/V ratio) related to the DC power applied by the power application part. The calculator uses the measured physical quantity related to the DC power in the correlation function between the wear amount of the conductive member and the physical quantity related to the DC power to obtain a wear amount of the conductive member. As a result, the plasma processing apparatus can accurately measure the wear amount of the conductive member without having to open the processing container (chamber).

Further, in the plasma processing apparatus according to an embodiment, the conductive member is provided at a position facing the plasma in the processing container. As a result, the plasma processing apparatus can accurately measure the wear amount of the conductive member facing the plasma without having to open the processing container.

Further, in the plasma processing apparatus according to an embodiment, the conductive member is made of a silicon-containing material. As a result, the plasma processing apparatus can accurately measure the wear amount of the conductive member made of the silicon-containing material.

Further, the plasma processing apparatus according to an embodiment further includes another conductive member (e.g., the GND block 89) provided at a position facing the plasma in the processing container and set to a ground potential. As a result, the plasma processing apparatus can accurately measure the wear amount of the conductive member which is electrically coupled to another conductive member of the ground potential via the plasma.

Further, in the plasma processing apparatus according to an embodiment, when a reference conductive member having a specified thickness (e.g., the upper top plate 16b having a wear amount of 0 mm) is used as the conductive member, the calculator measures a first physical quantity (e.g., a reference I/V ratio) for the DC power applied to the reference conductive member. When a reference conductive member having a thickness smaller than the specified thickness (e.g., the upper top plates 16b having a wear amount of 0.2 mm or 2.0 mm) is used as the conductive member, the calculator measures a second physical quantity (e.g., a reference I/V ratio) for the DC power applied to the worn reference conductive member. Then, the plasma processing apparatus obtains a correlation function based on the first physical quantity and the second physical quantity. As a result, the plasma processing apparatus can appropriately obtain the correlation function of the physical quantity related to the wear amount of the conductive member and the DC power.

Further, the plasma processing apparatus according to an embodiment further includes a notification part configured to notify an alert when the obtained wear amount of the conductive member is equal to or larger than a threshold value. As a result, the plasma processing apparatus can notify the manager of the plasma processing apparatus of the replacement time of the conductive member.

It should be noted that the embodiment disclosed herein is exemplary in all respects and is not restrictive. The above-described embodiment may be omitted, replaced, or changed in various forms without departing from the scope of the appended claims and the gist thereof.

For example, in the above-described embodiment, the I/V ratio of the DC power applied to the shower head 16, i.e., the ratio of the change amount of the direct current I to the change amount of the DC voltage V is measured. However, the ratio of the change amount of the DC voltage V to the change amount of the direct current I may be measured. When the measurement accuracy of the DC voltage V and the direct current I is high, the ratio of the direct current I to the DC voltage V or the ratio of the DC voltage V to the direct current I may be measured. These ratios are examples of physical quantities related to the applied DC power.

Further, in the above-described embodiment, the wear amount of the shower head 16 as the upper electrode (CEL) is measured. However, the wear amount of the conductive member other than the upper electrode may be measured. For example, when a variable DC power source is connected to the focus ring 5 as a conductive member, the wear amount of the focus ring 5 may be measured using the I/V ratio of the DC power applied from the variable DC power source to the focus ring 5.

Figure 7:
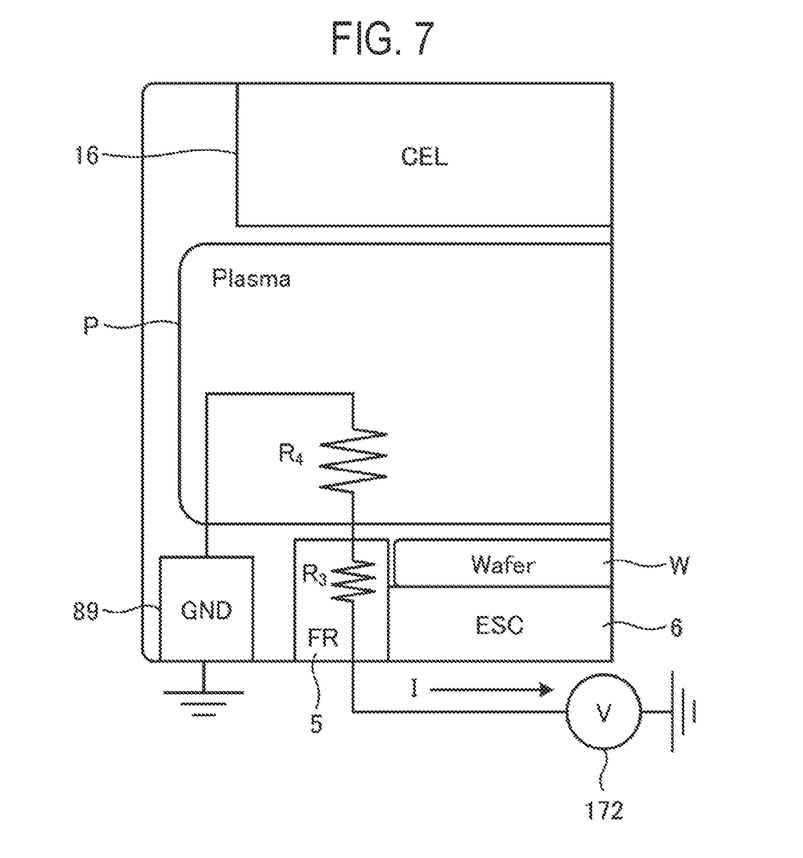
FIG. 7 is a diagram schematically showing an example of the state of electrical coupling of the focus ring when plasma is generated.

FIG. 7 is a diagram schematically showing an example of the state of electrical coupling of the focus ring 5 when plasma is generated. In the plasma processing apparatus shown in FIG. 7, a variable DC power source 172 is connected to the focus ring 5, which is a conductive member, via the LPF (not shown). As shown in FIG. 7, when the plasma P is generated in the processing container 1, the focus ring 5 is electrically coupled to the GND block 89 of the ground potential via the plasma P. The focus ring 5 and the plasma P may be electrically regarded as resistors R3 and R4, respectively, Therefore, when the plasma P is generated in the processing container 1, the space in the processing container 1 may be regarded as a series circuit iii which the resistors R3 and R4 are connected in series. The variable DC power source 172 applies a DC power to the focus ring 5 via the LPF to measure the DC voltage and direct current of the series circuit including the resistors R3 and R4. The variable DC power source 172 outputs the measurement result to the process controller 91.

Figure 8:
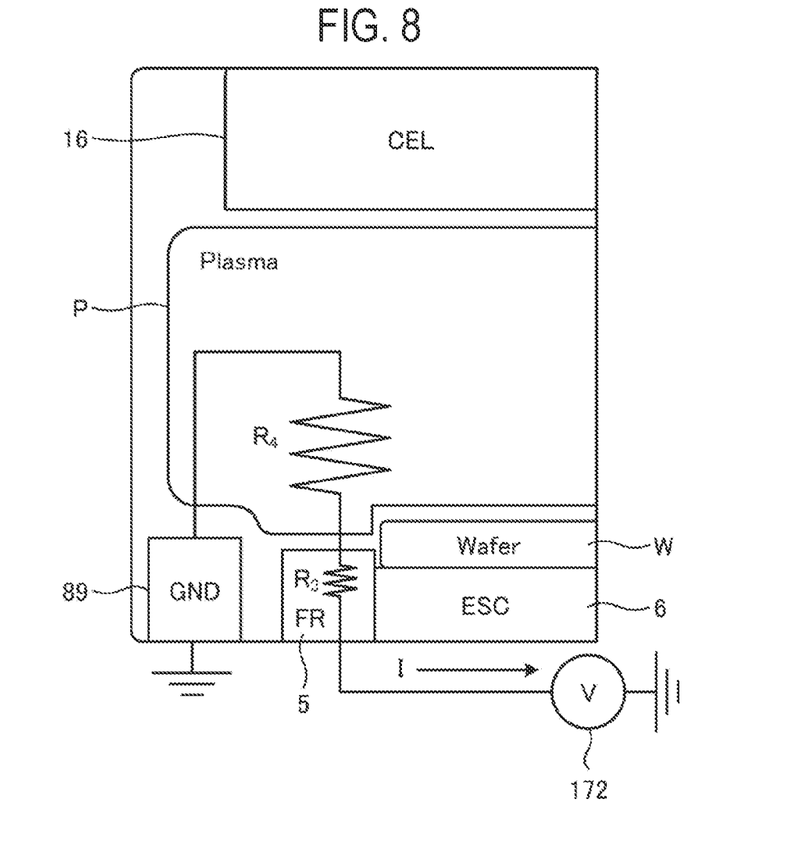
FIG. 8 is a diagram schematically showing an example of the state of electrical coupling of the worn focus ring.

When plasma etching is performed, the focus ring 5 is worn. As the focus ring 5 is worn, the values of the resistors R3 and R4 are changed. FIG. 8 is a diagram schematically showing an example of the state of electrical coupling of the worn focus ring 5. As shown in FIG. 8, when the focus ring 5 is worn, the value of the resistor R3 of the focus ring 5 decreases. On the other hand, as the focus ring 5 is worn, the processing space in which the plasma P is generated is expanded in the processing container 1, and the value of the resistance R4 of the plasma. P is increased. In this regard, the combined resistance R of the series circuit including the resistors R3 and R4 is represented by the following equation (8).

$$R = R3 + R4 + \text{Rothers} \quad (8)$$

In the above equation, Rothers denotes the resistance of other part including the GND block 89 and is a constant value.

Then, assuming that the DC voltage and the direct current of the series circuit including the resistors R3 and R4 are V and I, respectively, the following equation (9) is obtained according to the Ohm's law.

$$V = R \cdot I \quad (9)$$

The following equation (10) is obtained by modifying the equation (9).

$$I/V = 1/R \quad (10)$$

From the equation (9), it can be seen that the combined resistance R of the series circuit including the resistors R3 and R4 is changed as the I/V is changed. Then, from the equations (8) and (10), it can be seen that the combined resistance R of the series circuit including the resistors R3 and R4 and the I/V are changed as the values of the resistors R3 and R4 are changed due to the wear of the focus ring 5. Thus, the plasma processing apparatus obtains a wear amount of the focus ring 5 by acquiring a plurality of direct currents I for a plurality of DC voltages V, and measuring a change in I/V, i.e., an I/V ratio which indicates a ratio of the change amount of the direct current I to the change amount of the DC voltage V. The outline of the wear amount measurement process for the focus ring 5 is the same as that of the wear amount measurement process for the upper top plate 16b described in the above embodiment.

In addition, for example, when a variable DC power source is connected to the GND block 89 which is a conductive member, the wear amount of the GND block 89 may be measured using the I/V ratio of the DC power applied from the variable DC power source to the GND block 89.

According to the present disclosure in some embodiments, it is possible to accurately measure a wear amount of a conductive member without having to open a chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a processing container;
an upper electrode provided on a top wall portion of the processing container;
a DC power source electrically connected to the upper electrode;
a memory storing a predetermined correlation function representing a relationship between a wear amount of unused and pseudo upper electrodes and a reference physical quantity related to a DC power applied to the unused and pseudo upper electrodes;
a process controller configured to execute a process including:
generating plasma in the processing container;
applying a DC power from the DC power source to the upper electrode in a state where the plasma is generated in the processing container;
measuring a physical quantity related to the DC power applied to the upper electrode in the step of applying the DC power; and
obtaining a wear amount of the upper electrode using the measured physical quantity related to the DC power based on the predetermined correlation function stored in the memory; and
a GND block set to a ground potential,
wherein the upper electrode is provided at a position facing the plasma in the processing container, and
wherein the process further includes obtaining the wear amount of the upper electrode using a DC voltage and a direct current, which are measured in an electrical path from the upper electrode to the GND block via the plasma when the plasma is generated in the processing container.

2. The plasma processing apparatus of claim 1, wherein the upper electrode is made of a silicon-containing material.

3. The plasma processing apparatus of claim 2, wherein the GND block is provided at a position facing the plasma in the processing container.

4. The plasma processing apparatus of claim 2, wherein the process controller is configured to generate an alert when the obtained wear amount of the upper electrode exceeds a permissible value.

5. The plasma processing apparatus of claim 4, wherein, when the upper electrode and the plasma act electrically as resistors, respectively, and the upper electrode, the plasma, and the GND block are connected in series so as to act as a series circuit, the physical quantity related to the DC power includes a DC voltage of the series circuit and a direct current of the series circuit.

6. The plasma processing apparatus of claim 1, wherein the GND block is provided at a position facing the plasma in the processing container.

7. The plasma processing apparatus of claim 1, wherein a first physical quantity related to a DC power applied to the unused upper electrode having a specified thickness is measured,
wherein a second physical quantity related to a DC power applied to the pseudo upper electrode having a thickness smaller than the specified thickness is measured, and
wherein the predetermined correlation function is obtained based on the first physical quantity and the second physical quantity.

8. The plasma processing apparatus of claim 7, wherein when a plurality of pseudo upper electrodes having different thicknesses from each other is used to measure the second physical quantity, a plurality of second physical quantities related to a DC power applied to the plurality of pseudo upper electrodes is measured, and the predetermined correlation function is obtained based on the first physical quantity and the plurality of second physical quantities, and
wherein a thickness of each of the plurality of pseudo upper electrodes is smaller than the specified thickness.

9. The plasma processing apparatus of claim 1, wherein the process controller is configured to generate an alert when the obtained wear amount of the upper electrode exceeds a permissible value.

10. The plasma processing apparatus of claim 1, wherein, when the upper electrode and the plasma act electrically as resistors, respectively, and the upper electrode, the plasma, and the GND block are connected in series so as to act as a series circuit, the physical quantity related to the DC power includes a DC voltage of the series circuit and a direct current of the series circuit.

11. A plasma processing apparatus comprising:
a processing container;
a first conductive member;
a DC power source electrically connected to the first conductive member; and
a memory storing a predetermined correlation function representing a relationship between a wear amount of unused and pseudo first conductive members and a reference physical quantity related to a DC power applied to the unused and pseudo first conductive members;
a process controller configured to execute a process including:
generating plasma in the processing container;
applying a DC power from the DC power source to the first conductive member in a state where the plasma is generated in the processing container;
measuring a physical quantity related to the DC power applied to the first conductive member in the step of applying the DC power; and
obtaining a wear amount of the first conductive member using the measured physical quantity related to the DC power based on the predetermined correlation function stored in the memory; and
a second conductive member provided at a position facing the plasma in the processing container and set to a ground potential,
wherein the first conductive member is provided at a position facing the plasma in the processing container,
wherein the first conductive member is configured to be electrically coupled to the second conductive member via the plasma in the processing container, and
wherein, when the first conductive member and the plasma act electrically as resistors, respectively, and the first conductive member, the plasma, and the second conductive member are connected in series so as to act as a series circuit, the physical quantity related to the DC power is at least one of a ratio of a change amount of a direct current of the series circuit to a change amount of a DC voltage of the series circuit, a ratio of a change amount of a DC voltage of the series circuit to a change amount of a direct current of the series circuit, a ratio of a direct current of the series circuit to a DC voltage of the series circuit, and a ratio of a DC voltage of the series circuit to a direct current of the series circuit.

12. A plasma processing apparatus comprising:
a processing container;
an upper electrode provided on a top wall portion of the processing container;
a DC power source electrically connected to the upper electrode;
a process controller configured to execute a process including:
generating plasma in the processing container;
applying a DC power from the DC power source to the upper electrode in a state where the plasma is generated in the processing container;
measuring a physical quantity related to the DC power applied to the upper electrode in the step of applying the DC power;
obtaining a wear amount of the upper electrode using the measured physical quantity related to the DC power based on in a correlation function between the wear amount of the upper electrode and the physical quantity related to the DC power; and
adjusting a DC voltage applied from the DC power to the upper electrode according to the wear amount of the upper electrode so that a decrease in a direct current is eliminated; and
a GND block set to a ground potential,
wherein the upper electrode is provided at a position facing the plasma in the processing container, and
wherein the process further includes obtaining the wear amount of the upper electrode using a DC voltage and a direct current, which are measured in an electrical path from the upper electrode to the GND block via the plasma when the plasma is generated in the processing container.

* * * * *